(12) United States Patent
Frohberg et al.

(10) Patent No.: US 7,528,059 B2
(45) Date of Patent: May 5, 2009

(54) METHOD FOR REDUCING POLISH-INDUCED DAMAGE IN A CONTACT STRUCTURE BY FORMING A CAPPING LAYER

(75) Inventors: Kai Frohberg, Niederau (DE); Sandra Bau, Dresden (DE); Johannes Groschopf, Wainsdorf (DE)

(73) Assignee: Advanced Micro Devices, Inc., Austin, TX (US)

( * ) Notice: Subject to any disclaimer, the term of this patent is extended or adjusted under 35 U.S.C. 154(b) by 211 days.

(21) Appl. No.: 11/559,652

(22) Filed: Nov. 14, 2006

(65) Prior Publication Data

US 2007/0232063 A1 Oct. 4, 2007

(30) Foreign Application Priority Data

Mar. 31, 2006 (DE) ............... 10 2006 015 096

(51) Int. Cl.
*H01L 21/00* (2006.01)
(52) U.S. Cl. .............. 438/586; 438/624; 438/628; 438/633; 438/692; 438/697; 257/E21.243; 257/E21.244; 257/E21.246; 257/E21.274; 257/E21.275
(58) Field of Classification Search ........ 438/396, 438/586, 624–633, 692, 697, 781, 782, 902, 438/970; 257/E27.089, E21.243, 244, 246, 257/274, 275, 279, 576
See application file for complete search history.

(56) References Cited

U.S. PATENT DOCUMENTS

| | | | | |
|---|---|---|---|---|
| 4,983,546 A * | 1/1991 | Hyun et al. | .................. | 438/800 |
| 5,362,666 A * | 11/1994 | Dennison | .................... | 438/396 |
| 5,437,763 A * | 8/1995 | Huang | .................... | 438/624 |
| 5,503,882 A * | 4/1996 | Dawson | .................... | 438/763 |
| 5,849,637 A * | 12/1998 | Wang | .................... | 438/699 |
| 5,891,800 A * | 4/1999 | Ben-Guigui et al. | ........ | 438/631 |
| 5,972,803 A * | 10/1999 | Shu et al. | .................... | 438/781 |
| 6,001,731 A * | 12/1999 | Su et al. | .................... | 438/633 |
| 6,121,130 A * | 9/2000 | Chua et al. | .................... | 438/623 |
| 6,140,240 A | 10/2000 | Yang et al. | .................. | 438/692 |
| 6,150,272 A | 11/2000 | Liu et al. | .................... | 438/692 |
| 6,207,554 B1 | 3/2001 | Xu et al. | .................... | 438/624 |
| 6,228,760 B1 | 5/2001 | Yu et al. | .................... | 438/636 |
| 6,255,232 B1 * | 7/2001 | Chang et al. | .............. | 438/780 |
| 6,277,751 B1 * | 8/2001 | Niu et al. | .................... | 438/692 |
| 6,281,112 B1 * | 8/2001 | Sugiyama | .................... | 438/624 |
| 6,372,664 B1 * | 4/2002 | Jang et al. | .................. | 438/778 |
| 6,707,134 B1 * | 3/2004 | Li et al. | .................... | 257/637 |
| 2005/0176239 A1 | 8/2005 | Kronke et al. | .............. | 438/626 |

FOREIGN PATENT DOCUMENTS

WO  WO 91/10261  7/1991  ............. 21/90

* cited by examiner

*Primary Examiner*—Michael S Lebentritt
(74) *Attorney, Agent, or Firm*—Williams, Morgan & Amerson, P.C.

(57) ABSTRACT

By forming a capping layer after a CMP process for planarizing the surface topography of an ILD layer, any surface irregularities may be efficiently sealed, thereby reducing the risk for forming conductive surface irregularities during the further processing. Consequently, yield loss effects caused by leakage paths or short circuits in the first metallization layer may be significantly reduced.

17 Claims, 6 Drawing Sheets

METHOD FOR REDUCING POLISH-INDUCED DAMAGE IN A CONTACT STRUCTURE BY FORMING A CAPPING LAYER

BACKGROUND OF THE INVENTION

1. Field of the Invention

The present invention relates to the field of semiconductor manufacturing, and, more particularly, to the formation of an interconnect structure having a contact plug for directly contacting a circuit element.

2. Description of the Related Art

Semiconductor devices, such as advanced integrated circuits, typically contain a huge number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby requiring an even larger increase in the number of electrical connections to provide the desired circuit functionality. Therefore, the number of stacked metallization layers usually increases as the number of circuit elements per chip area becomes larger and/or the sizes of individual metal lines and vias, as well as the spacing in between, are reduced. Consequently, for advanced semiconductor devices, the connection of the circuit elements with the first or lowest metallization layer requires a sophisticated contact technology for manufacturing respective contact plugs, which directly connect to contact regions of circuit elements, such as drain/source regions, gate electrodes of transistors and the like. Thus, the contact plugs provide the electrical contact of the individual circuit elements to the first metallization layer, which is formed above an interlayer dielectric material that encloses and passivates the circuit elements.

During the formation of respective contact plugs, a plurality of complex processes are performed, including the deposition of dielectric materials, the planarization of the dielectrics, the etching of contact openings, several cleaning processes, the filling in of appropriate contact metals and the like, wherein certain problems may arise in a typical conventional process flow, as will be described in more detail with reference to FIGS. 1a-1d.

FIG. 1a schematically illustrates a cross-sectional view of a semiconductor device 100 in an advanced manufacturing stage. The device 100 may comprise one or more circuit elements 103 formed above a substrate 101 comprising a semiconductor layer 102, such as a silicon layer. The circuit elements 103 may represent field effect transistors, capacitors and the like, wherein critical feature sizes, for instance a gate length of the circuit elements 103 when representing field effect transistors, may be in the range of approximately 100 nm and significantly less. In this manufacturing stage, a contact etch stop layer 104, for instance comprised of silicon nitride, may be formed so as to enclose the circuit elements 103, followed by an interlayer dielectric material 105, which may be comprised of silicon dioxide.

Typically, the device 100 may be formed on the basis of the following processes. The circuit elements 103 may be manufactured in accordance with well-established recipes including advanced lithography, deposition, etch, implantation, anneal techniques and the like. Thereafter, the contact etch stop layer 104 may be deposited on the basis of well-established plasma enhanced chemical vapor deposition (PECVD) techniques, wherein, in sophisticated applications, the layer 104 may be provided with a specific intrinsic stress in order to enhance the performance of at least some of the circuit elements 103. Thereafter, the interlayer dielectric material 105 may be deposited on the basis of high density plasma assisted chemical vapor deposition (CVD) techniques or any other appropriate deposition method, wherein, for instance, TEOS may be used as a precursor material in order to form silicon dioxide with required characteristics with respect to mechanical stability, moisture rejection and the like. Although a plurality of recipes are well established in the art in which the interlayer dielectric material 105 may be deposited in a substantially flow-like manner, a certain degree of non-uniformity of the finally obtained topography may be observed, which may adversely affect any subsequent processes, such as a photolithography for a subsequent patterning of the layers 105 and 104 in order to form respective contact plugs therein. Consequently, the surface topography of the device 100 may be planarized by advanced chemical mechanical polishing (CMP) techniques.

FIG. 1b schematically illustrates the semiconductor device after the planarization of the interlayer dielectric material 105 by means of CMP, thereby providing a substantially planar surface topography, wherein, however, a plurality of small cracks, scratches and other surface irregularities 106 may have been formed during the mechanical stress caused by the CMP process.

After the planarization of the layer 105, further processes may be performed on the basis of the surface topography as shown in FIG. 1b, wherein, for instance, a photolithography may be performed in order to provide a resist mask (not shown) on the basis of which respective contact openings are formed in the material 105. During this etch process, respective contact openings in the layer 105 may be formed to different depths, depending on the respective contact regions of the circuit elements 103, and hence the contact etch stop layer 104 is provided to reliably stop and control the previous etch process. Thereafter, the resist mask may be removed and a further etch process may be performed in order to open the contact etch stop layer 104. Subsequently, any further cleaning processes may be carried out in order to prepare the device for the deposition of appropriate barrier and metal materials for forming contact plugs in the layers 105 and 104. During many of these process steps, the scratches, cracks and surface irregularities 106 may be exposed to the respective reactive ambients of the various processes, thereby leading to a significant increase in size of the irregularities 106 in the lateral and/or the vertical direction. Consequently, during the subsequent filling in of barrier and metal material, the increased surface irregularities 106 may also be filled with a respective conductive material, which may have a negative impact on the further processing and finally on the device performance.

FIG. 1c schematically illustrates the device 100 in a further advanced manufacturing stage after the completion of the above-described process sequence. Hence, the device 100 may comprise a plurality of contact plugs 107, which may be filled with a highly conductive metal 108, such as tungsten and the like, wherein typically a barrier material 109 may be formed between the dielectric materials of the layers 105 and 104 and the highly conductive metal 108. Moreover, as previously explained, respective enlarged surface irregularities 106A may also be filled with the highly conductive material 108 and the barrier material 109, thereby providing a plurality of regions, which may affect the operational behavior of at least some of the circuit elements 103. For example, the respective contact openings and thus the enlarged surface irregularities 106A may be filled on the basis of well-established deposition techniques, such as sputter deposition for the barrier material 109 and CVD techniques for the highly conductive material 108, wherein any excess material thereof may afterwards be removed by CMP, which may additionally contribute to a lateral and vertical increase in size of the surface irregularities 106A, for instance by bridging neighboring metal-filled scratches. Consequently, at least some of the metal-filled surface irregularities 106A may take on a significant lateral dimension, which may result in the generation of non-desired conductive paths.

FIG. 1d schematically illustrates the device 100 in a further advanced manufacturing stage, wherein a metallization layer 110 is formed above the interlayer dielectric material 105. The metallization layer 110 may comprise a plurality of metal trenches or metal lines 112, which may contain a highly conductive metal 114, such as copper, aluminum and the like, wherein, in advanced applications including a highly conductive material, such as copper or copper alloys and the like, a respective barrier material 115 may be provided. The metal lines 112 may be formed in an appropriate dielectric layer 111, for instance comprised of silicon dioxide, fluorine-doped silicon dioxide, low-k dielectric materials and the like. The dielectric layer 111 may be formed on an etch stop layer or barrier layer 113, for instance comprised of silicon nitride, silicon carbide, nitrogen-enriched silicon carbide and the like. The metallization layer 110 may be formed on the basis of well-established inlaid or damascene techniques, in which respective openings such as trenches are formed in the dielectric layer 111 and the etch stop layer 113 followed by an appropriate fill process for forming the barrier layer 115 and providing the bulk material 114.

As previously explained, during the previous processes, the lateral extension of some of the surface irregularities 106A may have been increased so as to form a conductive path between two neighboring metal lines 112, as is for instance shown at 116. Consequently, an operational failure or at least a significantly increased leakage current may be observed, thereby possibly rendering the device 100 non-operational. Consequently, increased yield loss may be observed, in particular for highly sophisticated semiconductor devices, in which the reduced feature sizes of the circuit elements 103 may also require respective reduced dimensions of the metal lines 112 and of the respective spacings, thus even further increasing the risk of operational failures caused by metal-filled surface irregularities, such as the irregularities 106A.

In view of the situation described above, a need exists for an enhanced technique for the formation of contact plugs while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of metal-filled metal regions in a dielectric layer, wherein the dielectric layer requires a planarization of the surface topography on the basis of CMP, while nevertheless the effects of surface irregularities may be significantly reduced. For this purpose, respective surface irregularities may be "passivated" or "sealed" by providing a capping layer and performing at least some of the subsequent processes for patterning the dielectric layer on the basis of the respective capping layer.

According to one illustrative embodiment of the present invention, a method comprises forming a first dielectric layer above a circuit element having a contact region and planarizing the first dielectric layer. Thereafter, a second dielectric layer is formed on the planarized first dielectric layer and a contact plug is formed at least in the first dielectric layer, wherein the contact plug connects to the contact region.

According to another illustrative embodiment of the present invention, a method comprises forming a dielectric layer above a circuit element of a semiconductor device and planarizing the dielectric layer by chemical mechanical polishing. Thereafter, a capping layer is formed on the planarized dielectric layer for at least partially filling surface defects in the dielectric layer. Additionally, the method comprises forming an opening in the dielectric layer after forming the capping layer.

BRIEF DESCRIPTION OF THE DRAWINGS

The invention may be understood by reference to the following description taken in conjunction with the accompanying drawings, in which like reference numerals identify like elements, and in which.

Figure 1A:
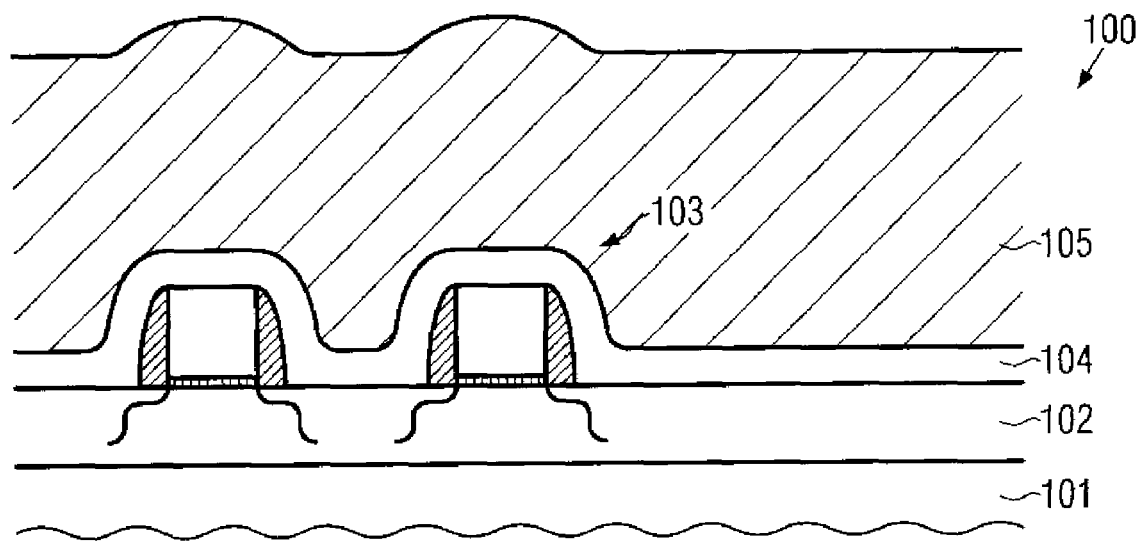
FIGS. 1a-1d schematically illustrate cross-sectional views of a semiconductor device during the formation of contact plugs according to conventional process strategies, thereby resulting in metal-filled surface irregularities.
Figure 1B:
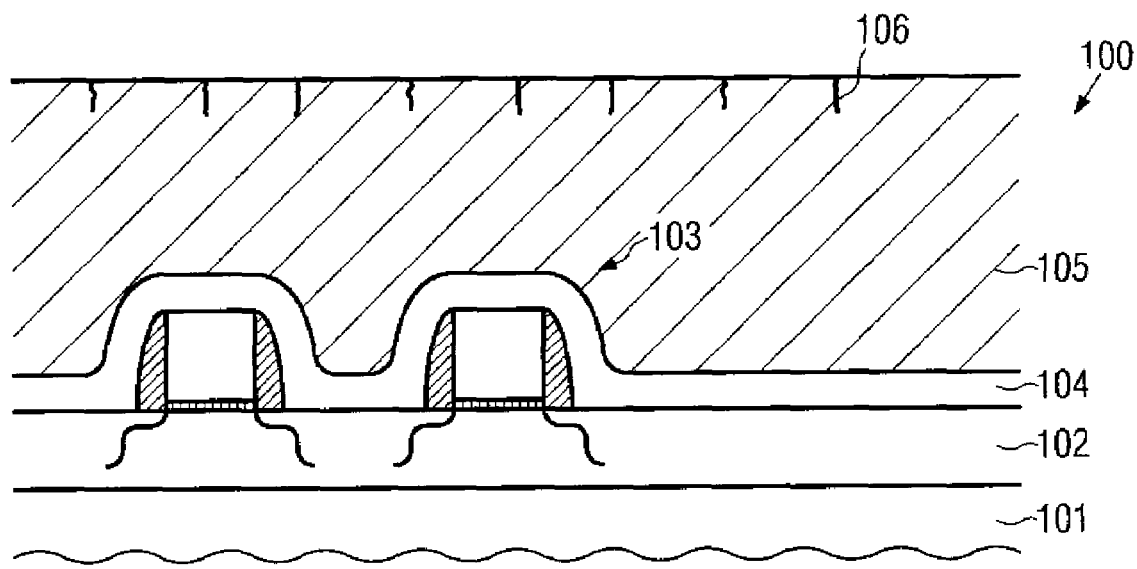
Figure 1C:
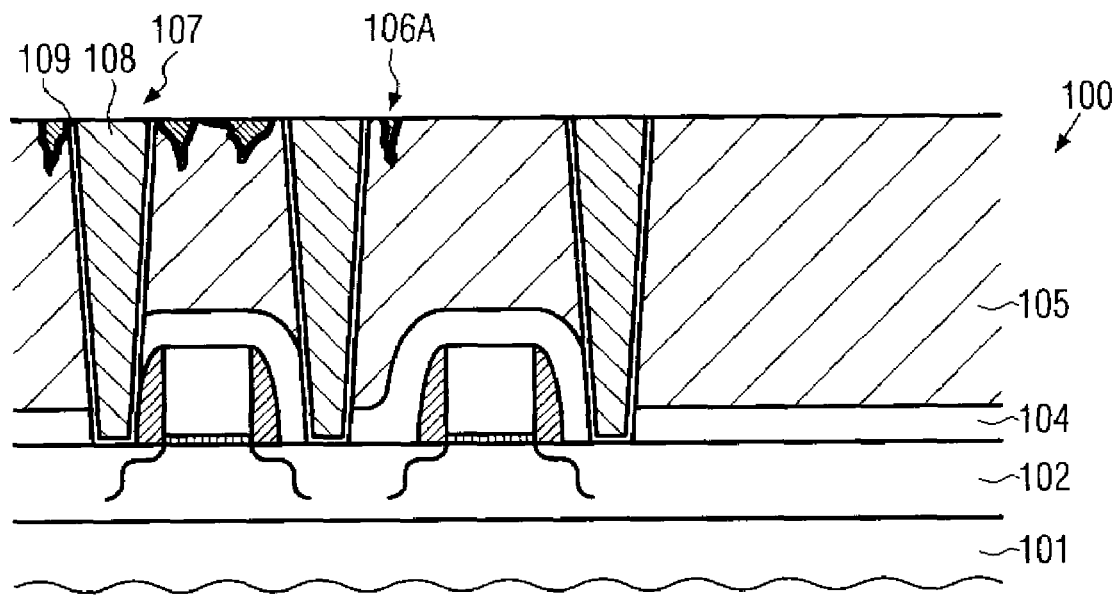

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of highly conductive metal regions, which in some illustrative embodiments may represent contact plugs, i.e., metal-filled vias which provide the electrical connection between respective contact regions of circuit elements with an overlying metallization layer. In many situations during the manufacturing process for semiconductor devices, a dielectric material has to be provided above a specific surface topography caused by underlying circuit elements wherein, however, for subsequent processes, a substantially planar surface may be required, due to process constraints of subsequent processes, such as photolithography and the like. Hence, advanced CMP techniques are frequently used for this purpose wherein, however, for certain material compositions of the dielectric material, a plurality of surface irregularities, such as scratches and the like, may be formed, although otherwise on a global scale a substantially planar surface is achieved. Since the surface irregularities may significantly influence further processes, as is previously described with respect to the formation of contact plugs, the present invention provides a technique for "passivating" the surface irregularities prior to performing subsequent patterning processes, which would otherwise lead to an increase of the size of the surface irregularities. Consequently, the increase in size and an accumulation of conductive material may be significantly suppressed. Moreover, in some illustrative embodiments, the planarization process may be performed as an intermediate process, thereby positioning respective surface irregularities at less critical device areas, wherein a subsequent continuation of the material deposition may additionally provide efficient passivation or filling with dielectric material of the respective surface irregularities.

It should be appreciated that the present invention is highly advantageous in the context of the formation of contact plugs, since here a high probability for creating non-desired leakage paths or short circuits in the first metallization layer may arise, thereby possibly leading to a significant loss in production yield. It should be appreciated, however, that the principles of the present invention may also be applied to any situation in which a dielectric layer is planarized by CMP prior to a patterning process, thereby providing enhanced process uniformity during the subsequent patterning processes. Consequently, unless specifically referred to in the following description as well as in the appended claims, the present invention should not be restricted to the formation of contact plugs.

Figure 2A:
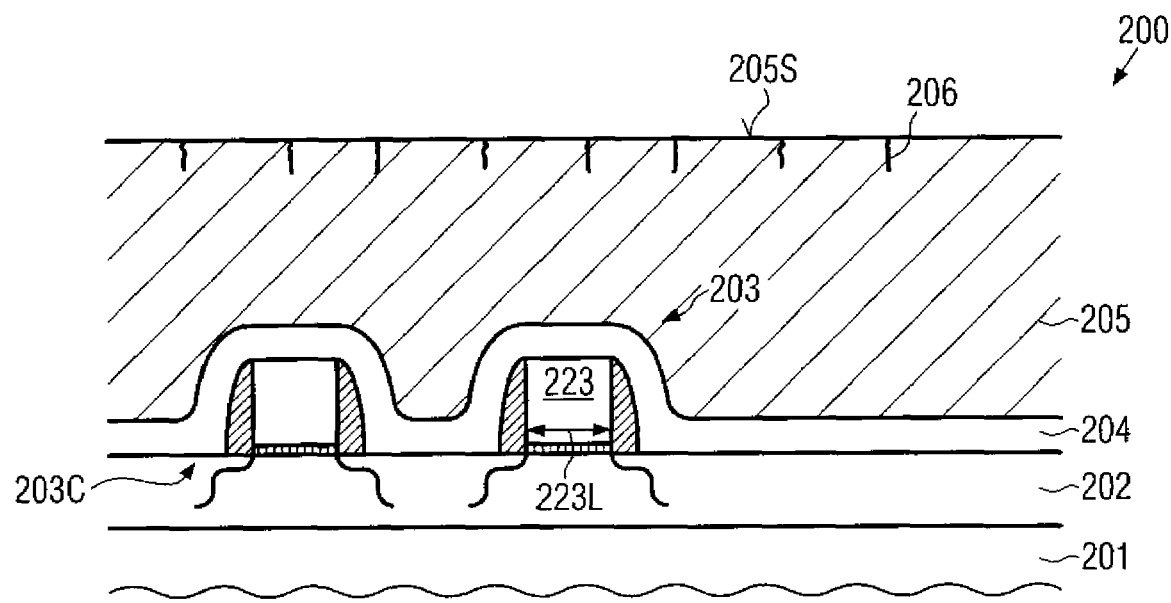
FIGS. 2a-2d schematically illustrate cross-sectional views of a semiconductor device during various manufacturing stages for forming a contact plug by using a capping layer after a CMP process according to illustrative embodiments of the present invention.

With reference to FIGS. 2a-2d, 3a-3c and 4a-4b, further illustrative embodiments of the present invention will now be described in more detail. FIG. 2a schematically illustrates a semiconductor device 200 in an advanced manufacturing stage. The device 200 may comprise a substrate 201 having formed thereon a semiconductor layer 202, which may represent any appropriate semiconductor material, such as silicon, silicon/germanium or other semiconductor materials. Moreover, the substrate 201, in combination with the semiconductor layer 202, may represent a silicon-on-insulator (SOI) substrate in which the semiconductor layer 202 may be formed on a buried insulating layer (not shown), wherein the layer 202 may have an appropriate thickness so as to enable the manufacturing of respective transistor elements, such as partially or fully depleted devices. Moreover, the device 200 may comprise one or more circuit elements 203, which in the embodiment shown are illustrated as field effect transistors having respective gate electrodes 223, which may have a gate length 223L according to design rules of a given technology. In some illustrative embodiments, the gate lengths 223L may be 100 nm and significantly less, or even 50 nm and less. Consequently, the spacing between neighboring circuit elements 203 may be in the range of several hundred nanometers, thereby requiring precisely positioned contact regions and plugs for connecting the circuit elements 203 to one or more overlaying metallization layers, which may also include metal lines with lateral dimensions of 200 nm and even significantly less with comparable lateral distances therebetween. Hence, in such sophisticated applications, avoiding any leakage paths or other irregularities may significantly influence the overall production yield.

The device 200 may further comprise an etch stop layer 204, which may be comprised of any appropriate material, such as silicon nitride. In advanced applications, the layer 204 may include two or more layers wherein the bulk material may be comprised of silicon nitride having a specified intrinsic stress, wherein the type and magnitude of intrinsic stress may even vary for different circuit elements 203. For convenience, the layer 204 is illustrated as being provided as substantially the same layer for each of the circuit elements 203. An interlayer dielectric material 205, which may comprise silicon dioxide, is formed above the circuit element 203 and on the etch stop layer 204, wherein, in other illustrative embodiments, the layer 205 may represent any dielectric layer formed on respective device areas having a specified surface topography caused by any underlying circuit features, such as the circuit elements 203. In still other illustrative embodiments, the interlayer dielectric material 205 may be comprised of other dielectric materials, such as materials of reduced permittivity, in order to reduce the parasitic capacitance between neighboring metal regions to be formed in the layer 205 and between neighboring circuit elements 203. For example, the material 205 may comprise a fluorine-doped silicon dioxide, or any other materials with reduced permittivity, for instance on the basis of porous materials, polymer materials, hydrogen enriched silicon oxycarbide (SiCOH) and the like. It should also be appreciated that the material 205 may be comprised of a plurality of materials, which may be formed on the basis of two or more sub-layers in order to provide the desired material characteristics. In this manufacturing stage, the material 205 may comprise a substantially planar surface 205S, wherein it should be understood that the term "planar" may refer to a global configuration of the material 205, which may nevertheless, on a local or micro scale, comprise a plurality of surface irregularities 206, such as scratches, cracks and the like.

The device 200 as shown in FIG. 2a may be formed on the basis of processes as are also described with reference to the device 100. It should be appreciated, however, that the formation of the contact etch stop layer 204, when provided with specific stress characteristics, may include the deposition of different layers having different intrinsic stresses, wherein a corresponding process strategy may involve the deposition of additional thin etch stop layers (not shown) in order to selectively remove any unwanted portions of the layer 204 above specific circuit elements 203. Moreover, the material 205 may be provided on the basis of any appropriate technique, such as high density plasma assisted CVD or sub-atmospheric CVD, when a substantially silicon dioxide-based material is to be formed. Respective recipes are well established in the art. In still other illustrative embodiments, a fluorine-doped silicon dioxide material may be provided or any low-k dielectric materials or a combination of well-established dielectrics, such as silicon dioxide, and low-k dielectric materials may be formed on the basis of established process techniques. Due to a residual non-desired topography of the material 205 after deposition, a CMP process may be performed, which may result in the surface irregularities 206, wherein the number and size thereof may significantly depend on the characteristics of the material 205. For example, even a relatively mechanically stable silicon dioxide may obtain a plurality of scratches, whereas less stable materials, such as low-k dielectric materials, may receive an even greater number of irregularities 206. Consequently, the irregularities 206 may be passivated or sealed for further patterning processes, wherein, in some illustrative embodiments, a capping layer may be provided which may be comprised of any appropriate material in order to at least partially fill and at least passivate the irregularities 206.

Figure 2B:
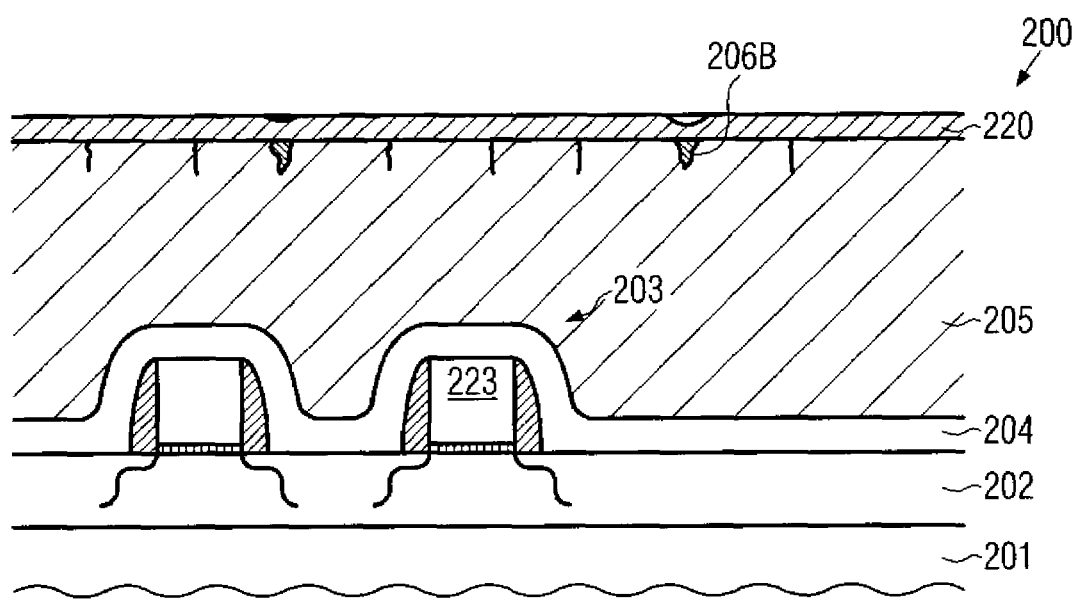

FIG. 2b schematically illustrates the device 200 after the formation of a capping layer 220, which, in one illustrative embodiment, may be comprised of substantially the same material as at least the surface portion of the material 205. For example, when the material 205 is substantially comprised of silicon dioxide, the capping layer 220 may also be provided as a silicon dioxide layer, wherein a thickness thereof may range from several nanometers to several tenths of nanometers, depending on process requirements. For instance, an average size of the surface irregularities 206, for instance in the vertical direction, may be determined on the basis of process data for a plurality of conventionally treated substrates and hence the thickness of the capping layer 220 may be selected on the basis of the obtained measurement results. For example, if for specified CMP parameters and for a given material composition and deposition technique for the material 205 an average "penetration depth" of the surface irregularities 206 of approximately 5-10 nm is observed, a thickness of approximately 20-60 nm for the capping layer 220 may be selected as a target value for a corresponding deposition process. Consequently, during a respective deposition process, the surface irregularities 206 may be filled, at least partially, with a capping material, thereby significantly reducing the probability for further enlarging the irregularities 206 during the further processing.

In other illustrative embodiments, the capping layer 220 may be formed of any other appropriate material, for instance it may be formed of silicon nitride and the like, thereby endowing the surface 205S and also the irregularities 206 contained therein, with an increased stability for the further processing, for instance for a further CMP process typically performed for removing any excess material in a later stage after filling the respective contact openings with a conductive material. By providing a different material for the capping layer 220, the process sequence for the patterning of the layer 205 may possibly have to be adapted, since, for instance, an initial etch step may be required for first opening the layer 220, and thereafter etching through the material 205 on the basis of well-established techniques. It should be appreciated that any appropriate deposition technique may be used for the formation of the capping layer 220, even highly conformal deposition techniques may be used, since a corresponding "micro" topography that may be caused by the surface irregularities 206 in a highly conformal process may not substantially negatively impact the further processing. In other cases, a substantially flow-like deposition behavior may be used in order to obtain a moderately smooth surface of the capping layer 220, even at a micro scale.

Thereafter, the further processing may be continued on the basis of well-established recipes, when, for instance, the capping layer 220 is comprised of substantially the same material as the layer 205, since then the corresponding patterning process may not have to be adapted to the presence of the capping layer 220. For instance, a photolithography process may be performed to obtain an appropriate resist mask on the basis of which an etch process may be carried out, as is previously described. That is, respective highly anisotropic etch recipes may be used to etch through the capping layer 220 and the material 205, wherein the respective etch process may be reliably stopped on and in the etch stop layer 204. Thereafter, the resist mask may be removed and the etch stop layer 204 may be opened on the basis of appropriate and well-established etch techniques. In other cases, the resist mask may be maintained during the opening of the etch stop layer 204. Thereafter, any cleaning processes may be performed, as required, wherein, however, the surface irregularities 206 which may be exposed to reactive etch and cleaning ambience, at least during some of the previously performed processes, may have a significantly reduced tendency for increasing their size due to the previous filling in of material of the capping layer 220.

In other illustrative embodiments, when the capping layer 220 may be formed of a different material, an initial etch step may be designed so as to efficiently etch through the capping layer 220 and thereafter well-established techniques may be employed in order to form respective openings in the layers 205 and 204, as is previously described. Also in this case, an interaction of the reactive ambients with the irregularities 206 may be significantly suppressed.

Figure 2C:
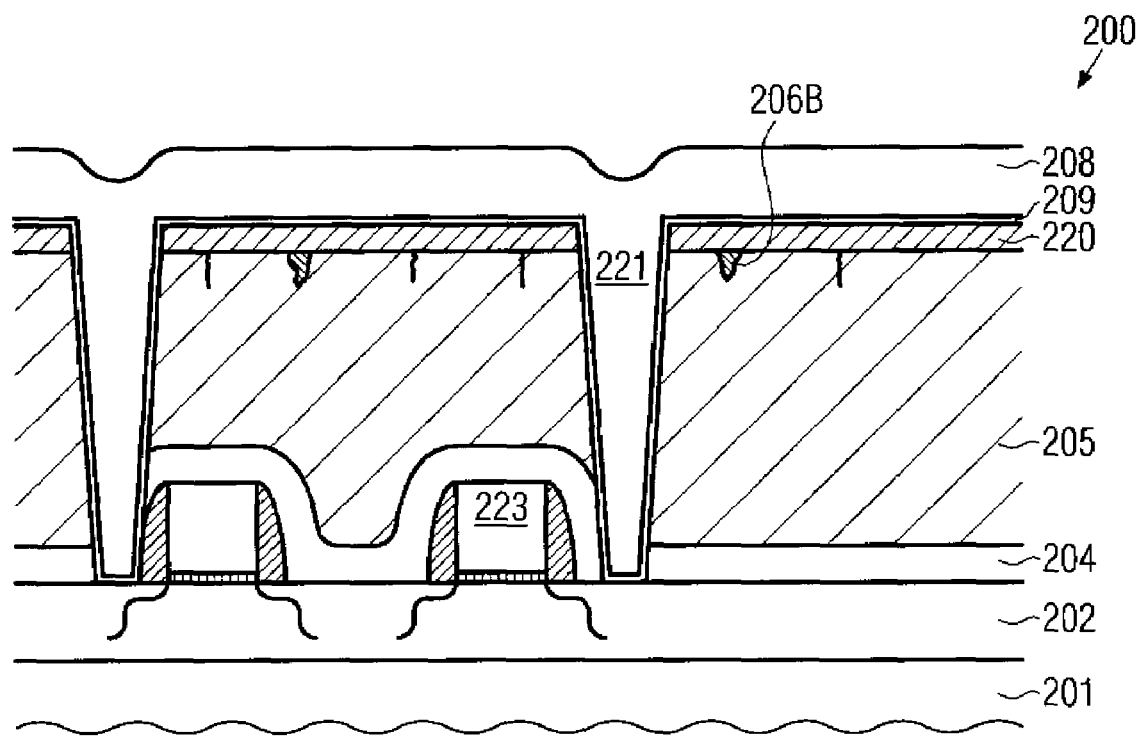

FIG. 2c schematically shows the semiconductor device 200 in a further advanced manufacturing stage. Here, respective openings 221 are formed in the dielectric material 205 and the etch stop layer 204, wherein, in the illustrative embodiment shown, the openings 221 may represent contact openings, which are filled by an appropriate barrier layer 209, for instance comprised of any appropriate material that may provide the required characteristics for the formation of a bulk metal layer 208 and/or which may provide respective diffusion and adhesion characteristics. For instance, the barrier layer 209 may represent a titanium and/or titanium nitride-based layer, which may be used so as to reduce any adverse effects during the deposition of a tungsten-based layer, when the layer 208 is provided as a tungsten layer for respective contact plugs, which directly connect to respective contact regions 203C of the circuit elements 203. In other illustrative embodiments, the barrier layer 209 may represent any other appropriate material which may significantly reduce the diffusion of material of the layer 208 into the neighboring dielectric materials 205 and 204. As shown, during the preceding processes for patterning the openings 221 and forming the layers 209 and 208, the irregularities 206B may not be substantially affected by the processing due to the dielectric fill material contained therein. Hence, a corresponding increase in size in the vertical as well as in the lateral direction may be significantly reduced.

Figure 2D:
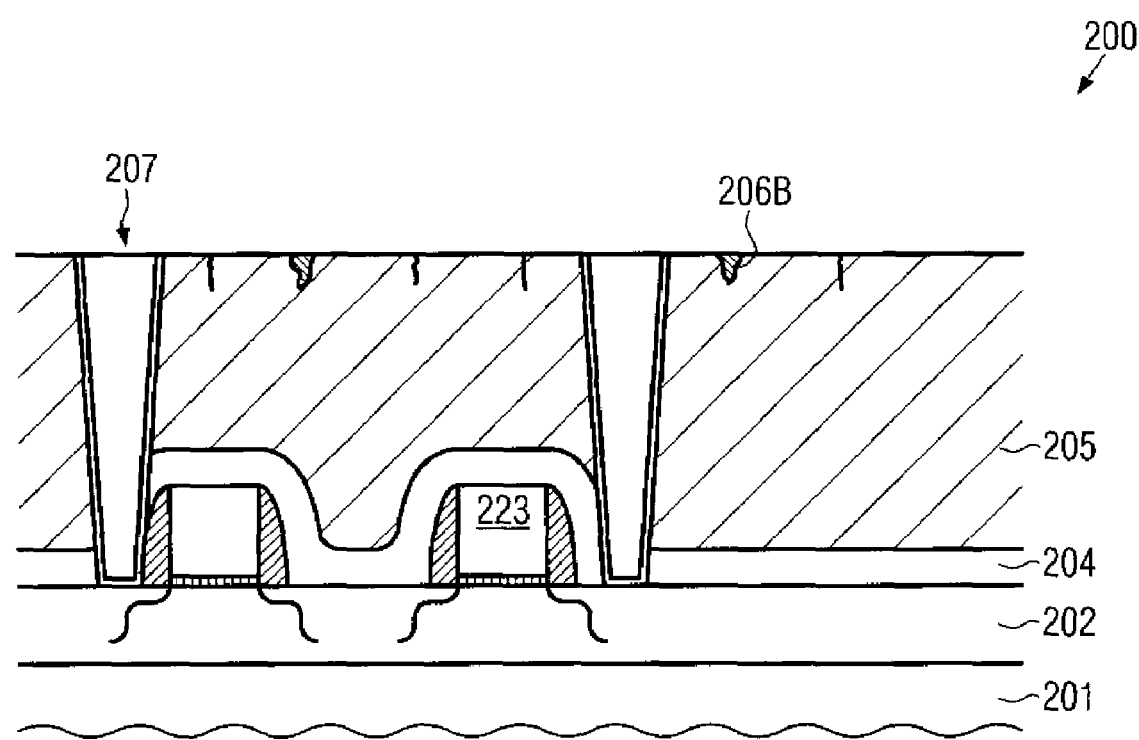

FIG. 2d schematically illustrates the semiconductor device 200 in a further advanced manufacturing stage after the removal of any excess material of the layers 209 and 208. In some illustrative embodiments, the capping layer 220 may also be removed during the corresponding planarization process, which may comprise a CMP process. During this process, the irregularities 206B may exhibit a significantly enhanced mechanical stability, thereby reducing any CMP-induced damage. Moreover, since the irregularities 206B may be substantially filled with the dielectric material, any metal residues above the irregularities 206B may also be efficiently reduced during the CMP process. Hence, any metallic residues outside the openings 221 are significantly reduced compared to the conventional process flow. Consequently, the device 200 may comprise metal-filled regions 207, which in the embodiment shown represent contact plugs, wherein any neighboring surface irregularities 206B may be significantly reduced in size, thereby also reducing the probability for metal accumulation therein.

Figure 1D:
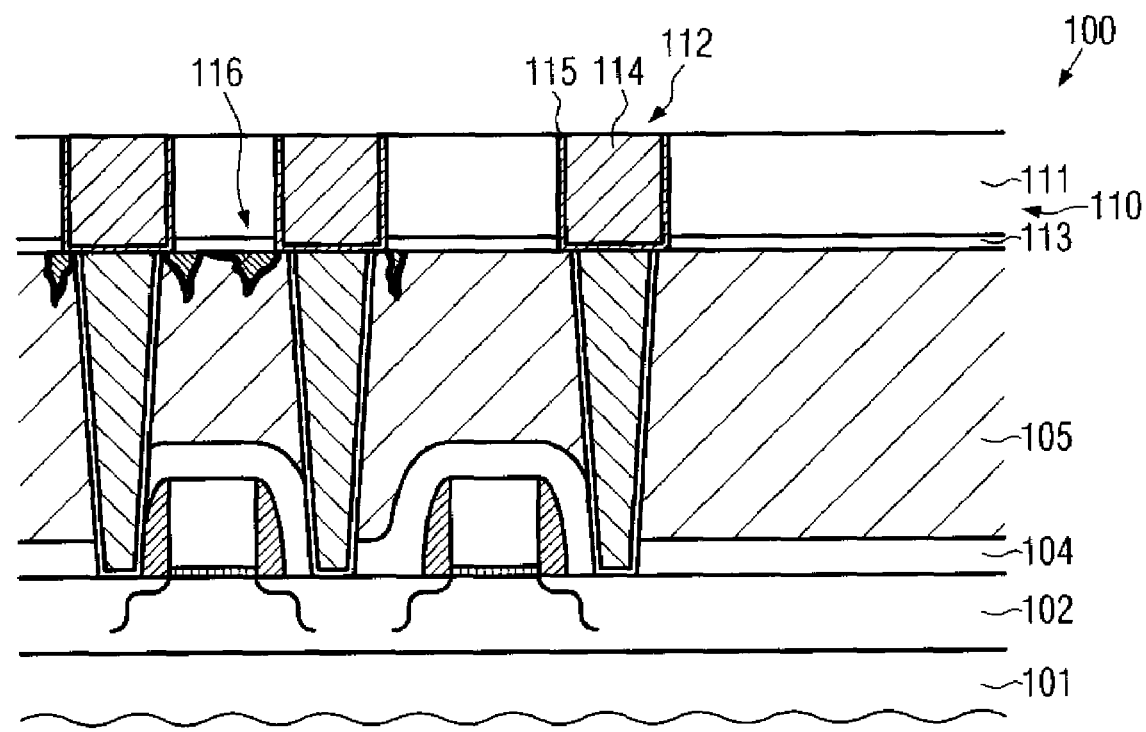

In other illustrative embodiments, the capping layer 220 may not be completely removed during the CMP process, while, in still other embodiments, as previously explained, the capping layer 220 may be formed of other materials, such as silicon nitride, which may be efficiently used during the CMP process for removing the excess materials of the layers 209 and 208 as a CMP stop layer. Thereafter, the further processing may be continued for instance on the basis of the formation of a metallization layer, as is for instance described with reference to FIG. 1d, wherein, due to the passivated irregularities 206B, a significantly reduced probability for creating leakage paths is achieved. Hence, even for highly scaled semiconductor devices having a reduced spacing between neighboring metal lines, any yield losses may be significantly reduced due to the provision of the capping layer 220 for efficiently "sealing" or passivating any CMP-induced surface irregularities.

Figure 3A:
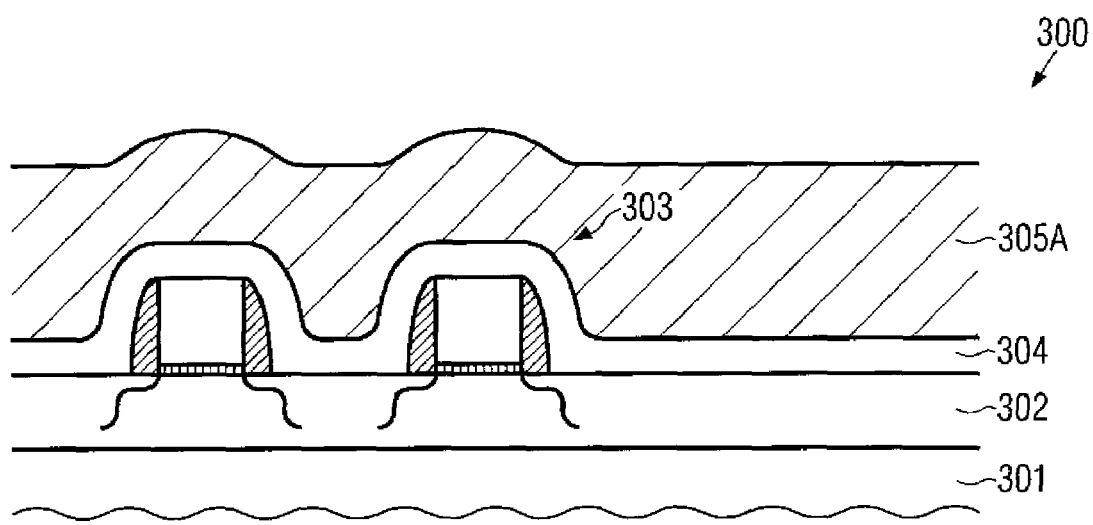
FIGS. 3a-3c schematically illustrate cross-sectional views of a semiconductor device during the formation of a planar interlayer dielectric material with a reduced number of surface irregularities according to still further illustrative embodiments of the present invention.
Figure 3B:
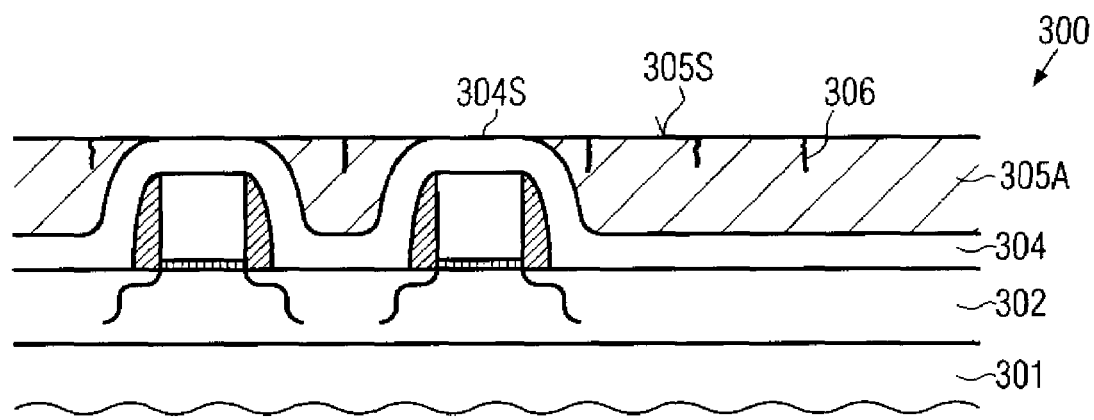
Figure 3C:
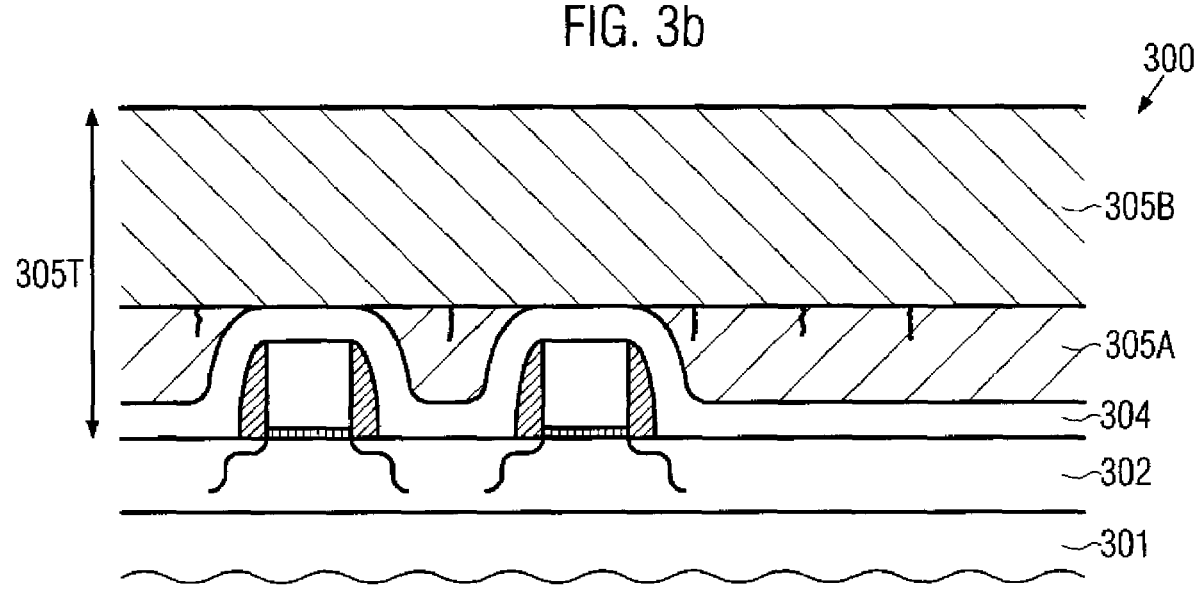

With reference to FIGS. 3a-3c, further illustrative embodiments will now be described in more detail, in which, during the formation of an interlayer dielectric for receiving contact plugs, an intermediate planarization process may be performed so as to locate any irregularities at less critical device regions and also provide enhanced passivation thereof.

FIG. 3a schematically illustrates a semiconductor device 300 which may comprise a substrate 301 having formed thereabove a semiconductor layer 302. Moreover, respective circuit elements 303 are formed in and on the semiconductor layer 302, wherein, with respect to the components 301, 302 and 303, the same criteria apply as previously explained with reference to the device 200. Furthermore, the device 300 may comprise a contact etch stop layer 304, which may have similar characteristics as previously described with reference to the layer 204. Moreover, a first portion 305A of an interlayer dielectric material is formed above the circuit elements 303 in such a manner that the corresponding topography thereof may be planarized, however without reaching a target height of an interlayer dielectric material for the device 300. That is, the material 305A, which may comprise silicon dioxide and the like, may be deposited in a first process on the basis of process parameters, which provide a sufficient excess height that enables a subsequent planarization by CMP, wherein the resulting height of the planarized layer 305A does not correspond to the final target height. For instance, if a target height for an interlayer dielectric material of several hundred nanometers is required, the layer 305A may be deposited with a thickness of approximately 200-400 nm and may be subsequently planarized on the basis of well-established CMP techniques. In one illustrative embodiment, the corresponding CMP process may be controlled on the basis of the etch stop layer 304, i.e., the CMP process may be stopped upon exposing the etch stop layer 304 at elevated areas, which may be identified on the basis of a different polishing resistance due to a different hardness of the layer 304 compared to material 305A, or an optical endpoint detection of the CMP process may be used to identify the exposure of elevated portions of the etch stop layer 304.

FIG. 3b schematically illustrates the device 300 after the completion of a respective CMP process, wherein a plurality of surface irregularities 306 may have been generated, as is previously described. Moreover, on a global scale, the surface 305S of the layer 305A is substantially planar except for the micro topography caused by the irregularities 306, wherein, in the embodiment shown, the thickness of the layer 305A may have been reduced so as to expose elevated portions 304S of the etch stop layer 304. Consequently, in this case, a reliable control of the CMP process may be achieved and hence the initial thickness of the layer 305A is less critical, thereby providing enhanced process margins for the deposition of the layer 305A. As shown, since the surface irregularities 306 caused by the CMP process are located at a height level that is significantly less than a target height of an interlayer dielectric material, the irregularities 306 may therefore not unduly affect the further processing during the formation of contact plugs or other metal-containing regions.

FIG. 3c schematically illustrates the device 300 in a further advanced manufacturing stage, in which a second portion 305B of the interlayer dielectric material is formed on the planarized layer 305A. For instance, the second portion 305B may be comprised of substantially the same material as the portion 305A when a substantially continuous interlayer dielectric material is desired. The portion 305B, which may be considered as a capping layer since the irregularities 306 are covered and partially or completely filled by the material of the layer 305B, may, in combination with the layer 305A, provide a target height 305T of the interlayer dielectric material of the device 300. Since the deposition process for forming the portion 305B may be performed on the planar surface 305S, the resulting surface topography of the portion 305B may not require a further planarization process and hence the respective surface portion 305B may be substantially devoid of any CMP-induced surface irregularities. Consequently, the further patterning process of the layers 305B, 305A and 304 may be performed on the basis of well-established recipes, wherein the risk of generating metal-filled irregularities at the surface of the portion 305B is significantly reduced. Even if the irregularities 306 may lead to the generation of a certain degree of metal-filled protrusions during the formation of contact plugs or metal regions in the layers 305B, 305A and 304, the risk for creating leakage paths or short circuits is significantly reduced due to the less critical position of the irregularities 306 and the fact that they may at least be partially filled and thus sealed during the process for depositing the layer portion 305B.

Consequently, a highly reliable process technique may be provided, wherein a reduced probability for the creation of metal-containing irregularities is achieved, while, on the other hand, a target height 305T of the interlayer dielectric material may be determined, in some illustrative embodiments, on the basis of a deposition process, since the previous planarization process for planarizing the portion 305A may be controlled on the basis of the etch stop layer 304. Hence, an improved process uniformity for obtaining the target height 305T may be achieved compared to other process strategies, in which the target height 305T is substantially determined by a CMP process after depositing the entire interlayer dielectric material.

Figure 4A:
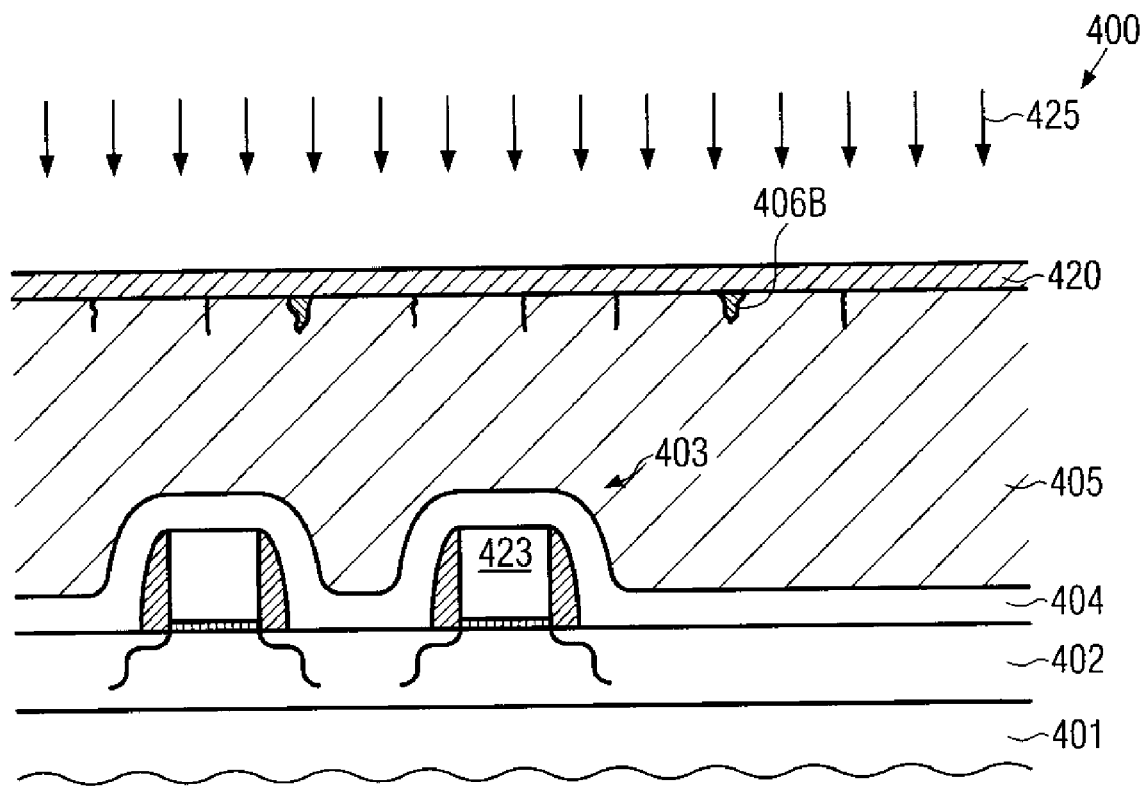
FIGS. 4a-4b schematically illustrate cross-sectional views of a semiconductor device during the formation of a planar interlayer dielectric with a reduced number of surface irregularities according to still further illustrative embodiments of the present invention.
Figure 4B:
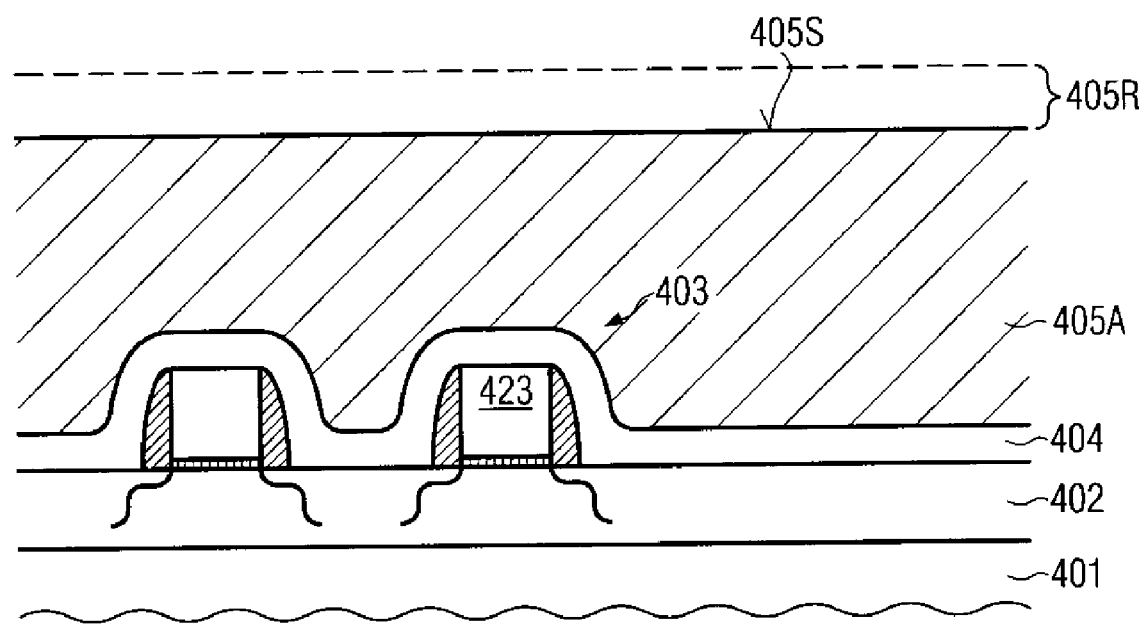

With reference to FIGS. 4a-4b, further illustrative embodiments will now be described in which a capping layer is formed after the planarization so as to seal or passivate the surface irregularities, wherein the capping layer, possibly in combination with a surface portion of the interlayer dielectric material, may be removed prior to actually patterning the interlayer dielectric material.

FIG. 4a schematically illustrates a semiconductor device 400 in an advanced manufacturing stage which may comprise a substrate 401, a semiconductor layer 402 in and on which may be formed a plurality of circuit elements 403. Furthermore, the circuit elements 403 may be embedded into a dielectric material comprising an etch stop layer 404 and an interlayer dielectric material 405. With respect to the components 401-405, the same criteria apply as previously explained with reference to the devices 100, 200 and 300. Moreover, in this manufacturing stage, the topography of the device 400 is substantially planarized by CMP, thereby creating a plurality of surface irregularities, as is previously described. Moreover, a capping layer 420 may be formed on the substantially planarized material 405, wherein, in some illustrative embodiments, the capping layer 420 may be made of substantially the same material as the layer 405 or a different material, as will be described later on. For example, if the material 405 may be deposited in a highly non-conformal, flow-like manner, the capping layer 420 may be provided so as to substantially completely fill the corresponding surface irregularities, thereby forming the substantially filled irregularities 406B. Thereafter, the device 400 may be exposed to a removal process 425, which may be designed as an etch process for removing the capping layer 420, wherein, in this case, an upper portion of the material 405 may also be removed, wherein a respective thickness of a removed portion may be selected on the basis of an average vertical extension of the irregularities 406B, thereby substantially removing the same. In this case, any mechanical differences between the continuously grown material of the layer 405 and the subsequently filled irregularities 406B may be removed, due to the removal of the respective surface portion. It should be appreciated that a corresponding height for removing a portion of the layer 405 may be determined in advance and may also be taken into consideration during the deposition of the material 405 so as to provide a sufficient excess height.

In other illustrative embodiments, the capping layer 420 may be provided in the form of a polymer material, a photoresist and the like so that the capping layer 420 may be formed in a highly non-conformal manner, for instance in a low-viscous state by spin coating and the like, thereby reliably filling the corresponding irregularities so as to provide the filled irregularities 406B in combination with a substantially planar surface topography of the capping layer 420. Thereafter, the capping layer 420 may be converted into its solid phase, for instance by curing and the like. Next, the etch process 425 may be performed so as to remove the material of the layer 420, wherein, in some illustrative embodiments, the etch process 425 may etch the material of the layer 405 and of the layer 420 with a similar etch rate, thereby etching into the layer 405 and increasingly removing the corresponding irregularities 406B. In other illustrative embodiments, the material of the layer 420 may have a different etch rate compared to the material of the layer 405 in a first etch step of the process 425 and thus the horizontal portions of the layer 420 may be removed selectively to the material of the layer 405, wherein at least lower portions of the irregularities 406B may remain covered by material of the layer 420. Subsequently, a further etch step of the process 425 may then be performed with high selectivity between the material of the layer 420 and the material of the layer 405, thereby removing an upper portion thereof, wherein a significantly reduced etch rate or a zero etch rate may be obtained within the irregularities 406B, thereby substantially avoiding a further increase of these irregularities into the material 405 during the ongoing removal of the layer 405. Consequently, the corresponding irregularities 406B may be removed by removing the upper portion of the layer 405, without transferring the corresponding irregularities into the deeper lying material portions of the layer 405.

In still other illustrative embodiments, the capping layer 420 may be provided in the form of a resist layer, which may also be applied in a highly non-conformal fashion, wherein, prior to the etch process 425, the layer 420 may be globally exposed to an appropriate exposure wavelength, wherein any resist material in the respective irregularities 406B is significantly less exposed compared to the horizontal portions of the layer 420, and thus the photochemical reaction in the irregularities may be significantly less in the irregularities 406B compared to the rest of the layer 420. Hence, the horizontal portions may be effectively removed by a development process while still significant amounts of non-exposed resist material may be within the irregularities 406B, which may then also be used as an "etch mask" during the etch process 425 for removing an upper portion of the layer 405.

FIG. 4b schematically illustrates the semiconductor device 400 after the completion of the above-described process sequence, wherein a portion 405R has been removed by the preceding etch process 425, thereby resulting in a substantially planar surface 405S, in which the number and the size of respective irregularities may be significantly reduced, wherein, depending on the selected removal height 405R, the layer 405A may be substantially devoid of any surface irregularities. Thus, the further processing, i.e., the patterning of the dielectric layers 405A and 404 for receiving corresponding contact openings and the subsequent fill with a highly conductive material, may be performed on the basis of the surface 405S with a significantly reduced risk for creating leakage paths and short circuits, as is previously described.

As a result, the present invention provides a technique for the formation of metal-containing regions in a dielectric material, the surface topography of which has to be planarized by CMP prior to patterning the layer. For this purpose, an appropriate capping layer may be formed after the CMP process so as to at least partially fill and thus seal or passivate respective irregularities prior to the actual patterning process, thereby reducing the probability for increasing the size of the respective irregularities when exposed to reactive ambient during the etching and cleaning processes. Moreover, due to efficient filling of the surface irregularities, which in some embodiments may also be formed at less critical device locations, an accumulation of conductive material in the respective irregularities may be significantly reduced, even if any further CMP processes, for instance for removing any excess metal and the like, have to be performed. Consequently, in some illustrative embodiments, contact plugs, directly connecting to respective contact regions of circuit elements, may be formed in a highly reliable fashion, even for highly scaled semiconductor devices requiring closely spaced contact plugs and metal lines.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first dielectric layer above a circuit element having a contact region;
    planarizing said first dielectric layer;
    forming a second dielectric layer on said planarized first dielectric layer; and
    forming a contact plug at least in said first dielectric layer, said contact plug connecting to said contact region, wherein at least a portion of said second dielectric layer is removed when forming said contact plug.

2. The method of claim 1, further comprising forming a contact etch stop layer above said circuit element, wherein said first dielectric layer is formed on said contact etch stop layer.

3. The method of claim 1, wherein a thickness of said first dielectric layer is greater than a thickness of said second dielectric layer.

4. The method of claim 1, wherein a thickness of said first dielectric layer is less than a thickness of said second dielectric layer.

5. The method of claim 1, wherein planarizing said first dielectric layer comprises performing a chemical mechanical polishing process.

6. The method of claim 5, wherein forming said second dielectric layer comprises depositing substantially the same dielectric material as is used for forming said first dielectric layer.

7. The method of claim 5, wherein said first dielectric layer is deposited with dielectric material with a first thickness selected to provide excess material for planarizing a surface topography by chemical mechanical polishing, and wherein said second dielectric layer is formed by further depositing said dielectric material to a predefined target height.

8. The method of claim 1, wherein forming said second dielectric layer comprises applying said second dielectric layer in a low viscous state, curing said second dielectric layer and removing said second dielectric layer and a surface portion of said first dielectric layer.

9. The method of claim 8, wherein said second dielectric layer and said surface portion of said first dielectric layer are removed by an etch process.

10. A method, comprising:
    forming a dielectric layer above a circuit element of a semiconductor device;
    planarizing said dielectric layer by a chemical mechanical polishing process;
    forming a capping layer on said planarized dielectric layer for at least partially filling surface defects in said dielectric layer;
    removing at least a portion of said capping layer; and
    forming an opening in said dielectric layer after removing at least said portion of said capping layer, said opening extending to a contact region of said circuit element.

11. The method of claim 10, further comprising forming a contact element in said opening, said contact element directly connecting to said circuit element.

12. The method of claim 11, wherein said capping layer is comprised of substantially the same material as said dielectric layer.

13. The method of claim 10, wherein forming said capping layer comprises applying a dielectric material in a low viscous state and removing excess material of said dielectric material when said dielectric material is in a solid state.

14. The method of claim 10, further comprising forming an etch stop layer prior to forming said dielectric layer and patterning said dielectric layer using said etch stop layer as an etch stop.

15. The method of claim 14, wherein said dielectric layer is deposited with a thickness sufficient to planarize a surface topography and wherein said capping layer is deposited so as to obtain a target height for an interlayer dielectric layer in combination with said planarized dielectric layer.

16. The method of claim 15, wherein said etch stop layer is used for controlling said planarizing of said dielectric layer.

17. The method of claim 10, wherein removing at least a portion of said capping layer comprises:
    removing said capping layer disposed above said dielectric layer; and
    removing at least a portion of said dielectric layer.

* * * * *